United States Patent [19]
Shah

[11] Patent Number: 5,002,395
[45] Date of Patent: Mar. 26, 1991

[54] INTERFEROMETRIC ACOUSTO-OPTIC SPECTRUM ANALYZER

[75] Inventor: Manhar L. Shah, Melbourne Beach, Fla.

[73] Assignee: MVM Electronics, Palm Bay, Fla.

[21] Appl. No.: 305,196

[22] Filed: Feb. 2, 1989

[51] Int. Cl.$^5$ .............................................. G01B 9/02
[52] U.S. Cl. ................................. 356/349; 350/358; 324/77 K
[58] Field of Search ................ 356/345, 349; 350/358, 350/400; 324/77 K

[56] References Cited

U.S. PATENT DOCUMENTS

| | | | |
|---|---|---|---|
| 4,297,704 | 10/1981 | Marom et al. | 356/349 |
| 4,644,267 | 2/1987 | Tsui et al. | 350/358 |
| 4,684,828 | 8/1987 | Sommargren | 350/358 |
| 4,725,774 | 2/1988 | Davis et al. | 324/77 K |

FOREIGN PATENT DOCUMENTS 2107459  4/1983  United Kingdom ............ 324/77 K

Primary Examiner—Samuel Turner
Attorney, Agent, or Firm—Evenson, Wands, Edwards Lenahan & McKeown

[57] ABSTRACT

An interferometric spectrum analyzer employs a pair of Bragg cells arranged in an optically cascaded configuration such that both the signal beam and the reference beam travel along a common optical path. The beam-modifying properties of the Bragg cells are such that within a prescribed bandwidth of operation, the deflection properties of the respective cells are frequency complementary, namely different frequencies applied to the respective cells deflect the beam passing therethrough along the same optical path, to produce a beat frequency at the Fourier transform plane. In accordance with a first embodiment, complementary deflection action is achieved by using Bragg cells having respectively different acoustic velocities. In a second embodiment, each Bragg cell has the same acoustic velocity. The deflection/frequency complementary effect is obtained by the use of a birefringent material prism interposed between the Bragg cells, which produces angular deviation that depends upon the polarization and the direction of propagation of light passing through the prism.

15 Claims, 4 Drawing Sheets

INTERFEROMETRIC ACOUSTO-OPTIC SPECTRUM ANALYZER

FIELD OF THE INVENTION

The present invention relates in general to acousto-optic signal processing systems and is particularly directed to an interferometric acousto-optic spectrum analyzer in which the reference beam and signal beam travel along a common or shared path.

BACKGROUND OF THE INVENTION

The interferometric spectrum analyzer is an optical signal processing device in which a pair of separately modulated optical beams, derived from a common light beam source, are combined on a photodetector array, the output of which is proportional to the instantaneous magnitude spectrum $|F_T(\omega,t)|$, where $F_T(\omega,t)$ is the instantaneous spectrum of the input waveform $F(t)$ that has been converted into an optical waveform through an acousto-optic medium, such as an acousto-optic Bragg cell. Conventionally, the separately modulated optical beams are obtained by dividing an optical beam from a coherent light source such as a laser, into two separate paths, as in a conventional Mach-Zehnder scheme shown in FIG. 1.

More particularly, a collimated laser beam 10 from an optical source (e.g. laser) 11 is split by a beam splitter (e.g. half-silvered mirror) 13 into a reference path 21 and a signal path 23. Within the reference path 21, a first acousto-optic beam deflector (e.g. acousto-optic Bragg cell) 25 is driven by an appropriately modulated (e.g. linear frequency) reference signal which produces a deflected beam 27, the angle of deflection of which is proportional to the instantaneous frequency of the signal applied to the Bragg cell 25, and which is incident on a combining mirror 31. The undeflected beam 28 may be removed before or after the combining mirror 31. Within the signal path 23, a second Bragg cell 33 is inserted. An unknown frequency signal of interest to be analyzed is applied as an input to the Bragg cell 33, causing signal beam 23 to be deflected in proportion to the input frequency. The deflected beam 29 interferes with beam 27 through mirror 31 and the combined beams travel along path 35 or an equivalently symmetric other useful path 36.

Downstream of mirror 31, a Fourier transform lens 37 focusses the incident reference and signal beams from mirror 31 onto a photodetector array 41. On the photodetector array 41, located at the Fourier transform plane of lens 37, an interference pattern formed by the Fourier transform combination of the two (Bragg cell-modulated) beams is created. At the Fourier transform plane whereat the photodetector array is located, the deflected reference and signal beams combine to produce a beat frequency representative of the difference between the reference signal applied to Bragg cell 25 and the unknown signal of interest applied to signal Bragg cell 33. Since the input frequency to Bragg cell 25 is known and the spatial location of any beat frequency is frequency dependent, the contents of the unknown signal can be detected by monitoring the output of the photodetector array.

Other embodiments of conventional interferometric acousto-optic spectrum analyzers include the use of Koester prisms and parallel beams that are merged on a photodetector array output. Regardless of the type of system employed, however, the conventional separation/combining mechanism is subject to a number of disadvantages. First of all, because separate beam paths (reference and signal) and components are employed, the system suffers instability due to variations in temperature, vibration, air currents, etc and the problem of maintaining precise alignment of all of the components. In addition, when the signal source beam is separated into respective reference and signal beam paths, there is a loss of optical energy at the beam splitter upstream of the acousto-optic modulation elements, and at the beam combiner (mirror) downstream of the acousto-optic modulation components. This leads to a reduction in system dynamic range. Additionally, the large number of components required to achieve beam path separation and merging necessarily results in an increase in weight, volume and cost of the overall system.

SUMMARY OF THE INVENTION

In accordance with the present invention the above mentioned drawbacks of conventional interferometric spectrum analyzers are obviated by a configuration in which both the signal beam and the reference beam travel along a common optical path. For this purpose rather than arrange the reference Bragg cell and the unknown signal Bragg cell optically in parallel, the two units are optically cascaded or arranged in an optical serial manner between a coherent light source and a downstream Fourier transform focussing lens, which focuses a combined beam onto a photodetector array. The beam-modifying properties of the respective Bragg cells are such that within a prescribed bandwidth of operation, the deflection properties of the respective cells are frequency complementary, namely different frequencies applied to the respective cells deflect the beam passing therethrough along the same optical path, to produce a beat frequency at the Fourier transform plane.

In accordance with a first embodiment of the invention such complementary deflection action is achieved by using Bragg cells having respectively different acoustic velocities. Different acoustic velocities may be achieved using conventional mechanisms, such as the selection of different materials, applying a field or temperature difference in the same material, or through the use of a difference in crystalline orientation In a second embodiment of the invention, each of the reference Bragg cell and the signal Bragg cell has the same acoustic velocity. The deflection/frequency complementary effect is obtained by the use of a birefringent medium (wedge or prism) interposed between the Bragg cells, which produces differential angular deviations of light beams either having different directions, in one case, or different polarizations, in another case, passing through the material.

Pursuant to a further embodiment of the invention, the beam is transmitted through an acousto-optic material, on separate, spaced-apart surface portions of which beam deflecting acoustic waves are created. For this purpose separate surface acoustic wave devices may be mounted on a common surface of an acoustooptic substrate for the purpose of launching beam deflecting acoustic waves through sequentially disposed regions of the substrate through which the beam is travelling. By the attachment of a thin metallic or dielectric film at the surface, or by the application of a field or heat to one of these regions, the physical properties of the localized region of the substrate may be modified so as to vary the acoustic velocity of the wave travelling therethrough relative to the acoustic velocity of the wave launched in the other region.

DETAILED DESCRIPTION

Before describing exemplary embodiments of the common beam path interferometric acousto optic spectrum analyzer in accordance with the present invention, it is useful to examine the mechanism through which the present invention obviates the need for the beam splitter and combiner configurations of conventional systems.

The deflection of a light beam passing an acousto-optic medium (e.g Bragg cell) may be explained with reference to the Bragg matching diagram of FIG. 2, which illustrates respective deflected optical wave vectors derived from reference and signal acoustic regions having different acoustic velocities. In the acoustic medium the acoustic wave vector length K is defined by $$K = 2\pi f/v,$$

where $f$ = acoustic frequency, and
$v$ = acoustic velocity.

Figure 2:
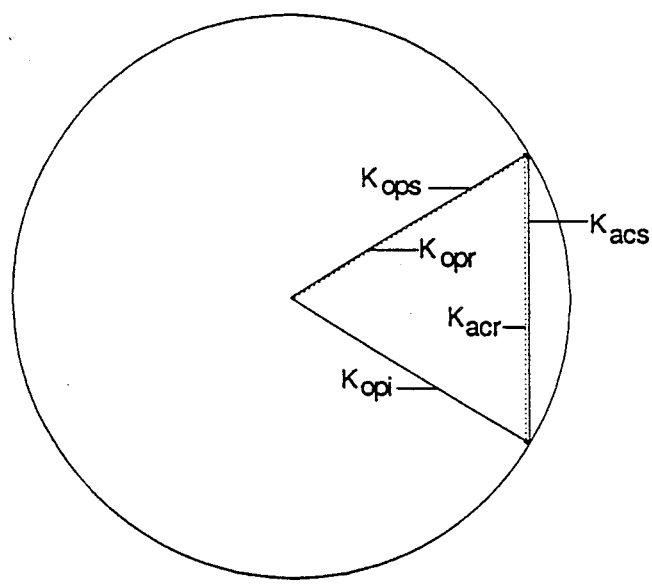
FIG. 2 illustrates respective deflected optical wave vectors derived from reference and signal acoustic regions having different acoustic velocities.

In the diagram shown in FIG. 2, $K_{opi}$ is the incident optical wave vector, $K_{opr}$ is the deflected optical wave vector for the reference Bragg cell, $K_{ops}$ is the deflected optical wave vector for the signal Bragg cell, $K_{acr}$ ($=2\pi f_r/v_r$) is the acoustic wave vector for the reference cell, $K_{acs}$ ($=2\pi f_s/v_s$) is the acoustic wave vector for the signal Bragg cell $v_r$ and $v_s$ are the acoustic velocities in the acoustic material for the reference and signal regions, respectively, $f_r$ and $f_s$ are the frequencies of the input signals applied to the reference and signal cells, respectively.

As can be seen from the diagram in FIG. 2, for a slight difference in acoustic velocity $(v_r - v_s)$ for the reference and signal regions, the angles of deflection of the optical beam for a given angle of incidence in the acoustic material are slightly different for a given frequency. A complementary corollary is the fact that the deflected beams emerging from the acousto-optic material will have the same angle of deflection when the input frequency applied to the respective regions is different and, in particular, has the same differential ratio as the acoustic velocities (i.e. $(f_r - f_s)/f_r = (v_r - v_s)/v_r$). Consequently when the resultant beams are imaged on a photodetector placed at the transform plane of a Fourier transform focussing lens a beat frequency signal will be produced.

Figure 3:
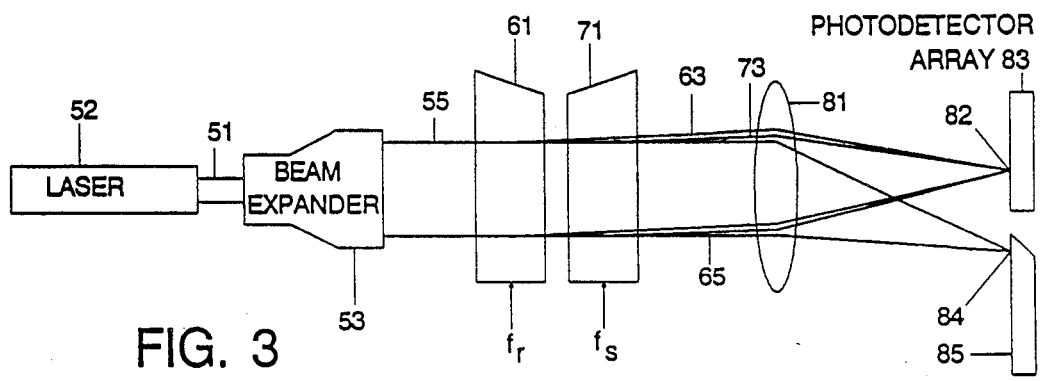
FIG. 3 diagrammatically illustrates an embodiment of an interferometric spectrum analyzer which makes use of the difference in acoustic velocities of a pair of optically cascaded acousto-optic beam deflectors.

A practical embodiment which makes use of the difference in acoustic velocities of a pair of serially arranged or cascaded acousto-optic beam deflector regions is shown in FIG. 3. More specifically, a coherent light beam 51 (derived from a suitable source (e.g. laser) 52) is expanded by a beam expander 53 (e.g. multiple lens expander) into a beam 55 which is directed toward a pair of serially arranged Bragg cells 61 and 71. For purposes of the description to follow, Bragg cell 61 will be denoted as the reference cell while Bragg cell 71 will be noted as the signal cell. It should be realized, however that the signals applied to the respective cells may be reversed. As a result of the application of a reference signal frequency $f_r$ to reference cell 61, a beam deflecting acoustic wave will travel through cell 61 and cause a first portion of incoming light beam 55 to be deflected along path 63 as it emerges from Bragg cell 61 along path 63. The remaining (undeflected) portion of the beam continues to travel in the same direction as incoming beam 55 and emerges as beam 65. Adjacent to and downstream of reference cell 61, Bragg cell 71 is driven by signal frequency $f_s$, which causes beam 65 to be deflected along path 73. The undeflected portion of the beam continues in the same direction as incident beam 65.

As pointed out above, the acoustic properties of Bragg cells 61 and 71 are such that their acoustic velocities differ from one another by a slight amount (e.g about one percent for practical cases). The actual magnitude of the difference in acoustic velocities is selected in accordance with the bandwidth of the signals to be applied to the cells and the desired beat frequency and spatial bandwidth of the downstream photodetector array 83 upon which the output beams of the cells are focussed by focussing lens 81. Differences in acoustic velocity can be achieved by conventional mechanisms including temperature control, the application of electric magnetic or stress fields, or selecting the crystals such that different crystalline directions are employed for the direction of propagation of acoustic wave from the input transducer through the cell. Alternatively, in surface or surface skimming bulk wave devices, a thin metallic or dielectric film may be deposited on the cell surface which is parallel to the direction of acoustic propagation, so as to stiffen the acoustic medium and thereby modify the acoustic velocity of the wave in the cell.

As explained above, and as can be seen from the vector diagram of FIG. 2, where the ratio of the frequency difference $(f_r - f_s)$ to the reference frequency $f_r$ is equal to the ratio of the acoustic velocity difference $(v_r - v_s)$ to the reference acoustic velocity $v_r$, the directions of the deflection of beam 63 from reference cell 61 and deflected beam 73 from signal cell 71 will be the same, causing Fourier transform focussing lens 81 to image a combined beam as a beat frequency spot 82 on a downstream Photodetector array 83. The non-deflected portion of input beam 55 is focussed by lens 81 at a region 84 that is intercepted by a stop 85.

Figure 3A:
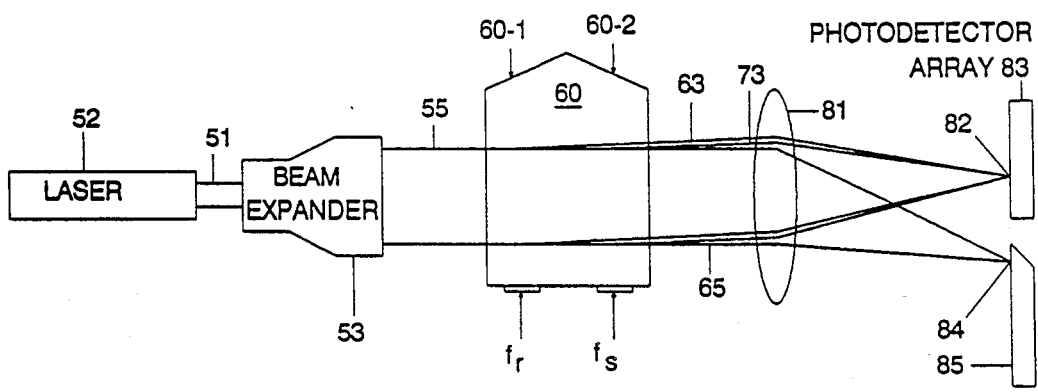
FIG. 3A shows a modified version of the embodiment of FIG. 3 in which multiple beam deflectors are contained within a single acousto-optic medium (two channel Bragg cell)

Rather than employ physically discrete components for the differential velocity Bragg cells 61 and 71, the beam deflector mechanism of the embodiment of FIG. 3 may be contained within a single acousto-optic medium (two channel Bragg cell) 60, as shown in FIG. 3A. The acoustic velocities of the localized regions 60-1 and 60-2 of medium 60 may be changed by applying different temperatures or fields to the respective regions.

Figure 1:
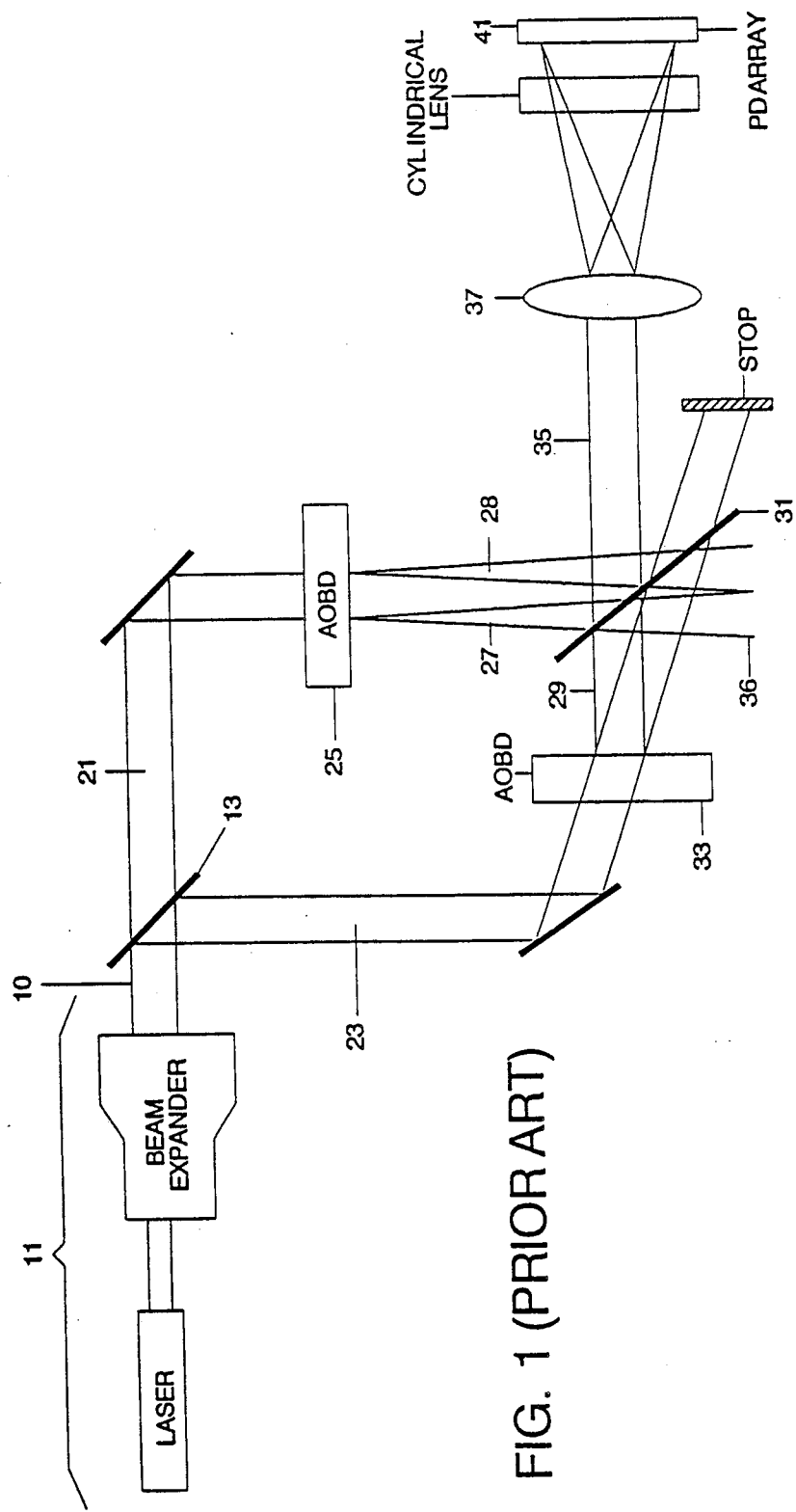
FIG. 1 is a diagrammatic illustration of a conventional Mach-Zehnder configuration of an interferometric spectrum analyzer having separate (split) paths for reference and signal beam modulation.
Figure 4:
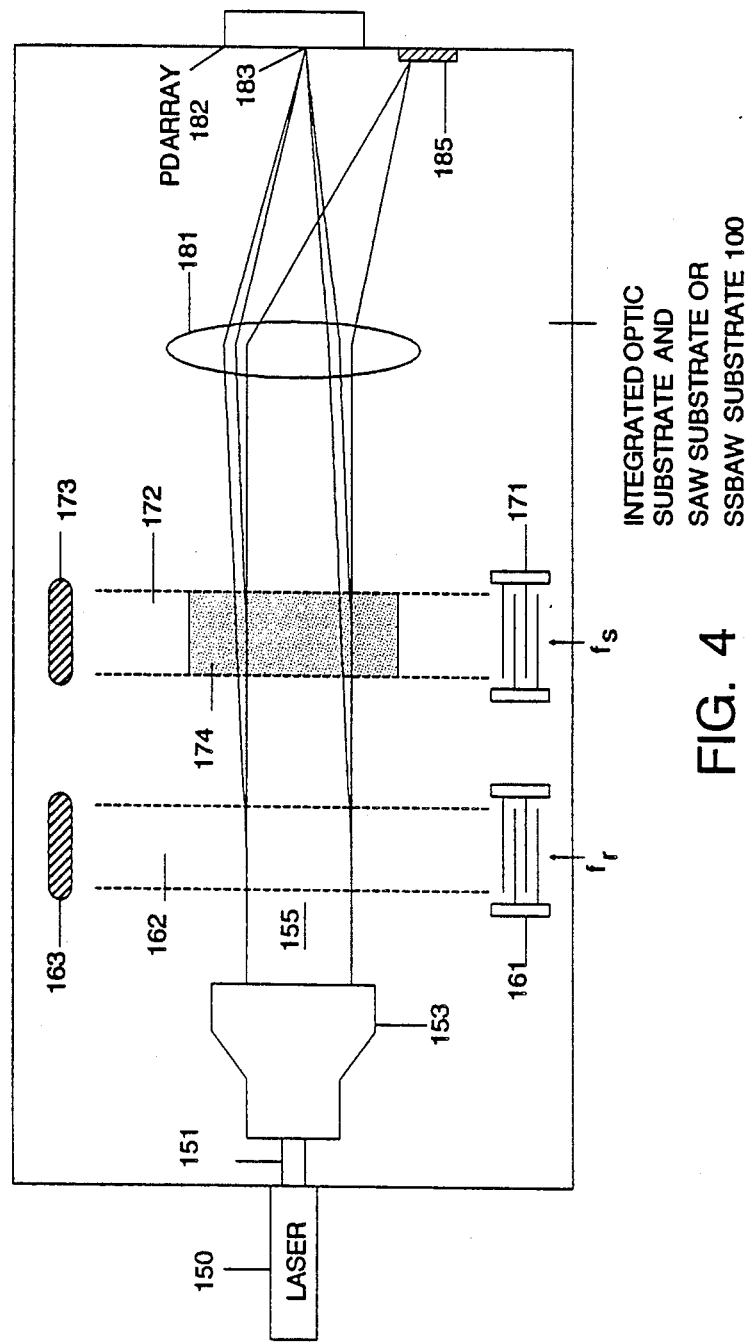
FIG. 4 diagrammatically illustrates an integrated configuration of a differential acoustic velocity interferometric spectrum analyzer using a common acousto-optic substrate.

The embodiment of FIG. 3 may also be configured in an integrated fashion using a common acousto-optic substrate, as diagrammatically illustrated in FIG. 4. In accordance with this modified version of the differential velocity embodiment, all of the components are fabricated on a common acousto-optic medium 100 comprising an optical waveguide. A laser 150 is optically coupled to one end of the waveguide directing a coherent light beam 151 into a beam expander 153, whose expanded output beam 155 travels through the upper surface portion of the bulk. Serially arranged downstream of beam expander 153 are surface acoustic wave (SAW) launching devices 161 and 171, which launch respective beam deflecting surface acoustic waves 162 and 172 into the bulk, in a direction transverse to the direction of travel of the expanded optical beam 155. At the opposite sides on the surface of the bulk respective acoustic absorbers 163 and 173 are provided.

To create the differential acoustic velocity characteristic, a thin metallic layer or dielectric layer 174 may be deposited on the top surface of the bulk. The differentially deflected beam components are focussed by a downstream transform lens 181 onto a photodetector array at the opposite end of the bulk 100. A suitable stop 185 is disposed adjacent to photodetector 182 to receive the nondeflected portion of the optical beam.

Figure 5:
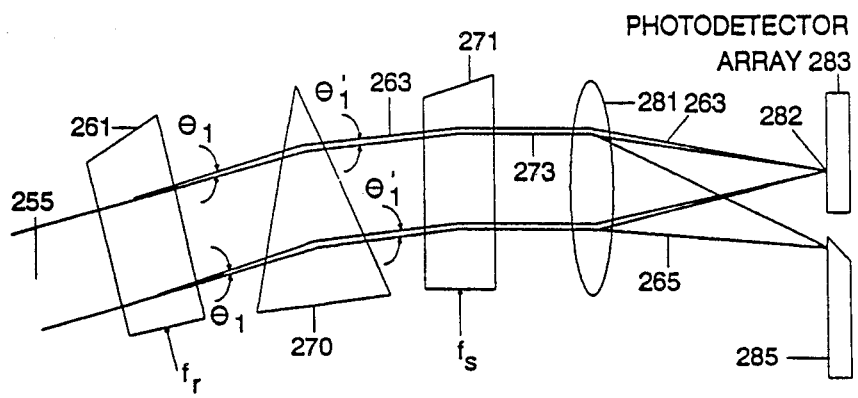
FIG. 5 diagrammatically illustrates a further embodiment of the invention which makes use of a birefringent prism between cascaded acousto-optic beam deflectors, to provide separate incident optical wave vectors by means of the polarization characteristics of the deflected beam, or through the angular separation of the deflected beam.

Instead of employing acousto-optic beam deflectors having different acoustic velocities (as incorporated in the embodiments of the invention shown in FIGS. 3 and 4), a further embodiment of the invention which makes use of the polarization characteristics of the deflected beam. For this purpose, as diagrammatically illustrated in FIG. 5, a birefringent wedge or prism may be interposed between the cascaded or serially arranged acous-to-optic beam deflectors (Bragg cells).

More particularly, a pair of Bragg cells 261 and 271 are optically cascaded in the path of an incident coherent light beam 255, and serve to deflect the beam towards a Fourier transform lens 281, which focusses the optical beams onto a downstream photodetector array 283. An optical (DC) stop 285 is arranged adjacent to, but spaced apart from, photodetector array 283. In the present embodiment, each of Bragg cells 261 and 271 has the same acoustic velocity. Consequently the differential deflection characteristic described above with respect to FIG. 2 for the embodiment of FIG. 3 is not applicable in the system shown in FIG. 5. Instead, a polarization switching acousto-optic interaction is used in conjunction with a birefringent wedge to achieve the desire complementary deflection with frequency characteristic.

More specifically wedge or prism 270 causes angular deviation of the light passing through it. The angular deviation depends upon the polarization of the incident light because of the birefringence of the prism or wedge. As diagrammatically illustrated in FIG. 5, in response to reference input frequency $f_r$, Bragg cell 261 deflects the incident optical beam 255 along path 263. By proper choice of the material of which Bragg cells 261 and 271 are made the polarization of the deflected beam 263 may be switched. Suitable materials for the Bragg cells may include shear mode gallium phosphide and slow shear mode tellurium oxide. Thus, the polarization of deflected beam 263 will be altered. Each of the polarization-modified deflected beam 263 and the undeflected beam 265 is incident upon prism 270. Because of the differences in polarization between the deflected and nondeflected beams, the angle of deviation of each beam as it passes through prism 270 will be different (due to the optical birefringent property of the prism). Consequently, depending upon choice of materials for the birefringent prism 270 and the orientation of prism 270 and downstream Bragg cell 271, deflected beam 273, emerging from Bragg cell 271, will travel in the same direction as deflected beam 263, subject to the deviation by prism 270, so that both beams 263 and 273 will travel along the same optical path and be focussed by lens 281 as a beat frequency spot 282 on photodetector array 283.

Figure 6:
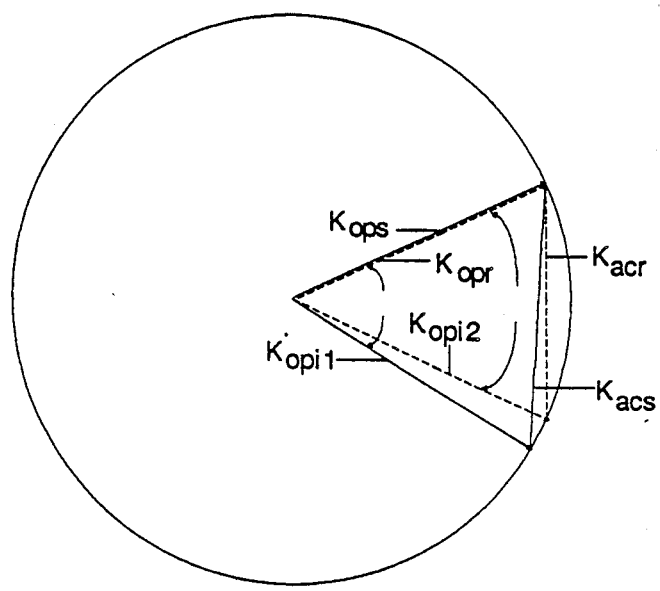
FIG. 6 is an acoustic optical wave vector diagram showing the angular variation or shift introduced by the prism in the configuration of FIG. 5.

The effect of the birefringence of prism 270 may be understood with reference to FIG. 6, which is an acoustic optical wave vector diagram similar to FIG. 2, but showing the angular variation or shift introduced by prism 270. In the Figure, the angle differential $(\alpha - \beta)$ is the angular shift of the incident beam introduced by prism 270. Vectors $K_{opi1}$ and $K_{opi2}$ are the incident optical wave vectors which undergo the respective angular shifts $\alpha$ and $\beta$, as shown. The remaining components of FIG. 6 are the same as those shown in FIG. 2, discussed above.

Because of the insertion of the deflection modifying wedge or prism 270, what would normally be different angles of deflection for different frequency signals applied to Bragg cells 261 and 271 are modified or complemented to result in the same travel path for deflected beams 263 and 273. Consequently, Fourier transform focussing lens 281 produces the above referenced beat frequency spot 282 on photodetector array 283.

In the present embodiment, the materials of which Bragg cells 261 and 271 are made effectively alter the polarization of the deflected waves, so that birefringent property of prism 270 can be used to effectively complement the different deflection angles of the Bragg cells for differences in frequency in the input signals. When the choice of materials of which the Bragg cells are made is limited to those which do not modify the polarization of the deflected waves, it is still possible to effect an angular shift between the deflected and nondeflected beams from the Bragg cell 261 and the beam passing through prism 270 by taking advantage of the birefringence property of the material. The extraordinary index of refraction changes with the direction of propagation of extraordinary wave in the birefringent material. Namely, the angle of deflection of the beam 263 deflected by Bragg cell 261 results in different indices of refraction in prism 270 for the deflected beam 263 and the undeflected beam 265 emerging from Bragg cell 261. Although the angular shift is small compared with the above-described polarization alteration embodiment, it is still of sufficient magnitude to result in a pair of beams 263 and 273 travelling in the same direction and producing a beat frequency on photodetector array 282. Depending upon the magnitude of the modification of the angular shift resulting from the use of wedge 270, one or more such wedges or prisms may be arranged optically in series or cascaded with one another to increase the total effect.

More particularly, when a birefringent wedge is used, there may be a preferred orientation for the optical axis of the wedge with respect to the optical beam polarization. Where a beam deflector causes polarization switching of the deflected beam (known as the anisotropic Bragg effect), the preferred orientation is such that the deflected beam travels through the wedge as an ordinary wave As a result, the angular deviation of the deflected beam is equal for all frequency components within the bandwidth of operation; hence, the beat frequencies of all the photodetectors are the same. Where the undeflected and deflected beam polarizations are the same, the preferred orientation of the optical axis of the wedge is such that nearly equal angular deviations occur for the deflected beam passing through the wedge for any frequency component within the bandwidth of operation.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. An interferometric acousto-optic system comprising:
    first means for receiving an optical beam travelling in a first direction and for deflecting a first portion of said optical beam in a second direction in accordance with a first signal applied thereto, while permitting a second portion of said optical beam to continue to travel in a direction other than said second direction, the deflected first portion of said optical beam having a first frequency determined by the frequency of said first signal;
    second means for receiving said second portion of said optical beam travelling in said other direction and deflecting part of said second portion of said optical beam in said second direction in accordance with a second signal applied thereto, the deflected part of said second portion of said optical beam having a second frequency determined by the frequency of said second signal, said second frequency being different from said first frequency;
    third means, disposed optically downstream of said second means, for generating an output representative of optical energy incident thereon; and
    fourth means for focussing said first portion of said optical beam and said part of said second portion of said optical beam onto said third means, so that a beat frequency is produced between said first portion of said optical beam and second part of said second portion of said optical beam, whereby said third means produces and output representative of said beat frequency.

2. An interferometric acousto-optic system according to claim 1, wherein said first and second means comprise respective first and second acousto-optic beam deflectors.

3. An interferometric acousto optic system according to claim 2, wherein said first and second acousto-optic beam deflectors have respectively different first and second acoustic velocities.

4. An interferometric acousto-optic system according to claim 2, wherein said first means includes a birefringent deflection medium disposed between said first and second acoustooptic beam deflectors.

5. An interferometric acousto-optic system according to claim 4, wherein said birefringent deflection medium comprises a birefringent prism.

6. An interferometric acousto-optic system according to claim 1, wherein said first and second acousto-optic beam deflectors comprise anisotropic Bragg deflection type beam deflectors optically coupled with a birefringent prism.

7. An interferometric acousto-optic system according to claim 3, including a substrate of acousto-optic material through which said optical beam is transmitted, and wherein said first and second acousto-optic beam deflectors respectively comprise first and second surface skimming bulk wave devices coupled to spaced apart surface portions of said of said substrate for launching optical beam-deflecting surface acoustic waves travelling at respectively different acoustic velocities into first and second surface regions of said substrate that are successively encountered by said optical beam during its travel therethrough toward said third means.

8. An interferometric acousto-optic system according to claim 3, including a substrate of acousto-optic material through which said optical beam is transmitted, and wherein said first and second acousto-optic beam deflectors respectively comprise first and second surface acoustic wave devices coupled to spaced apart surface portions of said of said substrate for launching optical beam-deflecting surface acoustic waves travelling at respectively different acoustic velocities into first and second surface regions of said substrate that are successively encountered by said optical beam during its travel therethrough toward said third means.

9. An interferometric acousto-optic system comprising:
    means for generating a beam of light and directing said beam in a first direction;
    a first acousto-optic beam deflector disposed in the path of said beam for deflecting a first portion of said beam in a second direction in accordance with a first signal applied thereto, while permitting a second portion of said optical beam to continue to travel therethrough undeflected in said first direction, the deflected first portion of said beam having a first frequency determined by the frequency of said first signal;
    a second acousto-optic beam deflector disposed in the path of said beam optically downstream of said first acousto-optic beam deflector for deflecting part of said second portion of said beam in said second direction in accordance with a second signal applied thereto, the deflected part of said second portion of said beam having a second frequency determined by the frequency of said second signal, said second frequency being different from said first frequency;
    photodetector means, disposed optically downstream of said second acousto-optic beam deflector, for generating an output representative of optical energy incident thereon; and
    means for focussing said first portion of said beam and said part of said second portion of said beam onto said photodetector means, whereat said deflected first portion of said beam and said deflected part of said second portion of said beam combine to produce a beat frequency signal representative of the frequency difference between the frequency of said first signal and the frequency of said second signal.

10. An interferometric acousto-optic system according to claim 9, wherein said first and second acousto-optic beam deflectors have respectively different first and second acoustic velocities.

11. An interferometric acousto-optic system according to claim 9, including a substrate of acousto-optic material through which said beam is transmitted, and wherein said first and second acousto-optic beam deflectors respectively comprise first and second surface acoustic wave devices coupled to spaced apart surface portions of said of said substrate for launching beamdeflecting surface skimming bulk waves travelling at respectively different acoustic velocities into first and second surface regions of said substrate that are successively encountered by said beam during its travel therethrough toward said photodetector means.

12. An interferometric acousto-optic system according to claim 9, including a substrate of acousto-optic material through which said optical beam is transmitted, and wherein said first and second acousto-optic beam deflectors respectively comprise first and second surface acoustic wave devices coupled to spaced apart surface portions of said of said substrate for launching optical beam-deflecting surface acoustic waves travelling at respectively different acoustic velocities into first and second surface regions of said substrate that are successively encountered by said optical beam during its travel therethrough toward said photodetector means.

13. An interferometric acousto-optic system according to claim 9, wherein said first means includes a birefringent deflection medium disposed between said first and second acoustooptic beam deflectors.

14. An interferometric acousto optic system according to claim 13, wherein said birefringent deflection medium comprises a birefringent prism.

15. An interferometric acousto-optic system according to claim 9, wherein said first and second acousto-optic beam deflectors comprise anisotropic Bragg deflection type beam deflectors optically coupled with a birefringent prism.

* * * * *